US012325907B2

(12) United States Patent
Orlov et al.

(10) Patent No.: US 12,325,907 B2
(45) Date of Patent: Jun. 10, 2025

(54) METHOD OF ION-PLASMA APPLICATION OF CORROSION-RESISTANT FILM COATINGS ON ARTICLES MADE FROM ZIRCONIUM ALLOYS

(71) Applicant: JOINT-STOCK COMPANY "TVEL", Moscow (RU)

(72) Inventors: Vladislav Konstantinovich Orlov, Moscow (RU); Alexander Olegovich Titov, Moscow (RU); Michail Yurjevich Kornienko, Moskovskaya oblast (RU); Nikolay Nikolaevich Krasnobaev, Moscow (RU); Alexander Alexandrovich Maslov, Moscow (RU); Vladimir Vladimirovich Novikov, Moscow (RU); Denis Sergeevich Saenko, Moscow (RU)

(73) Assignee: Joint-Stock Company "TVEL", Moscow (RU)

( * ) Notice: Subject to any disclaimer, the term of this patent is extended or adjusted under 35 U.S.C. 154(b) by 0 days.

(21) Appl. No.: 17/614,471

(22) PCT Filed: Apr. 20, 2020

(86) PCT No.: PCT/RU2020/000204
§ 371 (c)(1),
(2) Date: Nov. 26, 2021

(87) PCT Pub. No.: WO2021/215953
PCT Pub. Date: Oct. 28, 2021

(65) Prior Publication Data
US 2023/0032964 A1    Feb. 2, 2023

(51) Int. Cl.
*C23C 14/06* (2006.01)
*C22C 27/06* (2006.01)
(Continued)

(52) U.S. Cl.
CPC ............ *C23C 14/165* (2013.01); *C22C 27/06* (2013.01); *C23C 14/022* (2013.01); *C23C 14/352* (2013.01)

(58) Field of Classification Search
CPC ... C23C 14/165; C23C 14/022; C23C 14/352; C23C 14/345; C23C 14/354;
(Continued)

(56) References Cited

U.S. PATENT DOCUMENTS

| 4,798,663 A * | 1/1989 | Herklotz | C23C 14/541 |
| | | | 204/192.12 |
| 2014/0329073 A1* | 11/2014 | Barshilia | C23C 28/345 |
| | | | 428/457 |
| 2018/0096743 A1* | 4/2018 | Lahoda | G21C 3/20 |

FOREIGN PATENT DOCUMENTS

| CN | 201400714 Y | 2/2010 |
| CN | 102027564 A | 4/2011 |

(Continued)

OTHER PUBLICATIONS

Sidelev et al. "Nickel-Chromium (Ni—Cr) coatings deposited by magnetron sputtering for accident tolerant nuclear fuel claddings", Surface & Coatings Technology 369 (2019) 69-78 (Year: 2019).*
(Continued)

*Primary Examiner* — Rodney G McDonald
(74) *Attorney, Agent, or Firm* — Dentons US LLP

(57) ABSTRACT

A method of ion-plasma application of corrosion-resistant film coatings on articles made from zirconium alloys includes placing articles in a planetary carousel mechanism, heating the articles, and ion-beam etching and surface activation of the articles using water-cooled unbalanced magnetrons. In addition, the surface of the articles is activated using an ion source which generates gas ions with an accelerating voltage of up to 5000 V and with feeding of a bias voltage to the articles. The coating is applied by using
(Continued)

unbalanced and balanced magnetrons simultaneously with a residual induction of the magnetic field from 0.03 T to 0.1 T. The coating is applied to articles which are made from zirconium alloys and are placed vertically in a planetary carousel mechanism. The articles are heated in the coating application process to a temperature of 150-600° C., wherein the heaters are accommodated along the entire length of the articles. This produces corrosion-resistant film coatings of uniform thickness along the outer surface of articles made from zirconium alloys and raises productivity due to an increase in the discharge power density of magnetrons.

3 Claims, 2 Drawing Sheets

(51) Int. Cl.
*C23C 14/02* (2006.01)
*C23C 14/16* (2006.01)
*C23C 14/35* (2006.01)

(58) Field of Classification Search
CPC ....... C23C 14/46; C23C 14/541; C22C 27/06; H01J 37/32403; H01J 37/32779; H01J 37/3408; H01J 37/3417
USPC .......................... 204/298.09, 298.27, 192.16
See application file for complete search history.

(56) References Cited

FOREIGN PATENT DOCUMENTS

| | | |
|---|---|---|
| CN | 103212729 A | 7/2013 |
| CN | 203065570 U | 7/2013 |
| CN | 108315706 A | 7/2018 |
| CN | 109852943 A | 6/2019 |
| EP | 2050837 A1 | 4/2009 |
| JP | H07305166 A | 11/1995 |
| RU | 2199607 C2 | 2/2003 |
| RU | 2379378 C2 | 1/2010 |
| RU | 2465372 C1 | 10/2012 |

OTHER PUBLICATIONS

Machine Translation EP 2050837 A1 (Year: 2009).*
Europe Search Report dated Sep. 13, 2022 for application 20932662.8 (4 pages).
Starosta et al., Studies on magnetron-sputtered zirconium-silicide coatings deposited on zirconium alloy for the enhancement of their high-temperature oxidation resistance, Nukleonika 2018, 63(3), pp. 73-79.
Tikhonov et al., Performance of Protective Chromium-Based Coatings on a Zirconium Alloy in a Steam-Water Environment, 2011, English translation included (10 pages).
Zhong et al., Response of Cr and Cr—Al coatings on Zircaloy-2 to high temperature steam, Journal of Nuclear Materials, vol. 498, Jan. 2018 (24 pages).

* cited by examiner

METHOD OF ION-PLASMA APPLICATION OF CORROSION-RESISTANT FILM COATINGS ON ARTICLES MADE FROM ZIRCONIUM ALLOYS

This patent application claims a benefit of priority to a PCT International Application PCT/RU2020/000204 filed 20 Apr. 2020; which is herein incorporated by reference in its entirety for all purposes.

TECHNICAL FIELD

The invention relates to methods for generation of various coatings by method of ion-plasma magnetron sputtering, when materials in atom or ion form from vapor phase are deposited on the surfaces of the substrate being exposed to electric charge. The invention may be used in electronic, electrotechnical, nuclear, optical, and other industries.

BACKGROUND

The method of magnetron ion-plasma sputtering is one of the most effective processes for application of thin coatings. This method makes it possible, with relatively low costs, to obtain various homogeneous films that are tightly attached to the substrate and are connected to it on a molecular level. Currently this technology is widely used for scientific research and industrial developments for creation of a new generation of corrosion resistant and more durable articles.

There is an existing means of ion-plasma application of multi-component films using closed magnetic field and a device for its realization, which was developed by the company Teer Coatings LTD (U.S. Pat. No. 5,556,519, published in 1996). This method is based on using magnetrons made as an external and an internal poles, which are oriented in opposite directions, at least one of magnetrons is unbalanced, the neighboring magnetrons are installed mainly with the opposite polarity of external poles so that the area of deposition, where the substrate is placed, is surrounded mainly with closed lines of magnetic field formed by external poles of neighboring magnetrons, and at the same time the substrate is electrically displaced and formed as a cathode with the purpose to attract ions with a positive charge.

The fault is the fact that when coatings of complex composition are applied, which include materials with widely different sputtering ratios, the known methods and an installation for its realization do not make it possible to provide for high efficiency of the process when coatings of relatively high thickness are applied. This is explained by the complexity of ensuring high density of magnetron charge (above 40 W/cm$^2$) in the known process due to reduced concentration of plasma near the cathode with unbalanced magnetic field.

Under relatively low specific capacities of the charge, the above technological limitations arise, which reduce the functional capabilities of the technology to make articles of various purpose. Therefore, the known method may not always be used when applying coatings of complex composition and relatively high thickness. In the known plant it is not possible to provide for sufficient activation of the surface, since in this case it is necessary to bombard the surface with an independent ion beam or to supply high frequency alternating potential to the substrate.

The closest is the method (patent RU 2379378, IPC C23C 14/35, published in 2010), in accordance with which the following operations are carried out to apply a coating: preparation of unbalanced magnetrons with homogeneous targets, preparation of balanced magnetrons, installation of articles in a planetary carousel mechanism, preparation of the plant for operation, ion etching, and activation of articles using unbalanced magnetrons with charge density from 5 to 40 W/cm$^2$, additional activation of articles using an ion source, generating ions of gases, for example, argon, with accelerating voltage of up to 5000 V, heating of articles using a heater to temperature from 250 to 1200° C., application of the main coating layer using simultaneously unbalanced magnetrons with charge capacity density from 5 to 40 W/cm$^2$ and balanced magnetrons at charge capacity from 40 to 500 W/cm$^2$ and residual induction of magnetic field from 0.03 T to 0.1 T.

The faults of this method are the following: inability to achieve the even heating of articles along the entire length, which may cause coating damage; high temperatures of process implementation, which result in overheating of articles and negatively impact quality of the produced film coating.

DISCLOSURE OF THE INVENTION

The task that the proposed invention attempts to solve is to develop the method of applying corrosion resistant film coatings onto lengthy thin-walled articles from zirconium alloys and to improve efficiency of the film coating application process.

The technical result consists in obtaining corrosion resistant film coatings of even thickness along the outer surface of the articles from zirconium alloys and improving quality of applied coatings through even heating of the entire surface of articles, as well as increasing efficiency through higher density of magnetron charge capacity density.

The technical result is achieved by the method of ion plasma application of corrosion resistant film coating onto articles made of zirconium alloys, comprising placing the articles in a planetary carousel mechanism, performing ion-beam etching and surface activation of the surfaces using a plurality of water-cooled unbalanced magnetrons, additional activation of the surfaces using an ion source which generates a plurality of gas ions with an accelerating voltage of up to 5000 V, while feeding of a bias voltage to articles, applying the corrosion-resistant film coating by using an unbalanced magnetrons and balanced magnetrons simultaneously with a residual induction of a magnetic field from 0.03 T to 0.1 T, inclusively, wherein the articles made from zirconium alloys are heated by a plurality of heaters to a temperature between 150° C. and 249° C. before ion-beam etching is performed, the film coating is applied to articles placed vertically in the planetary carousel mechanism, and the articles are heated by the heaters the corrosion resistant film coating is applied to the temperature between 150° C. and 600° C., wherein the heaters are positioned along the entire length of articles facing the articles, wherein the unbalanced magnetron has a discharge power density between 41 W/cm2 and 80 W/cm2, inclusively, and the balanced magnetron has a discharge power density between 40 W/cm2 and 600 W/cm2, inclusively.

In a specific embodiment, the unbalanced magnetron has a discharge power density between 5 W/cm$^2$ and 80 W/cm$^2$.

In a specific embodiment, the balanced magnetron has a discharge power density between 40 W/cm$^2$ and 600 W/cm$^2$.

The chromium coating is applied.

Chromium alloy coating is applied, containing Cr, Al, Fe, Ni (Cr: 0-75%, Al: 0-2.1%, Fe: 0-22%; Ni: 0-2.5%).

Vertical arrangement of articles in a planetary carousel mechanism in process of coating application makes it possible to obtain a high quality coating through exclusion of deformation (distortion) of articles, and also coating damage (cracking, flaking off the article).

Heating to temperature of 150-600° C. in process of coating application makes it possible to obtain a high quality coating through ensuring the necessary thermal effect at the article and formed coating, which prevents their damage in process of application.

Placement of heaters along the entire length of articles makes it possible to implement their more even heating, which in its turn improves the quality of the applied coating (coating adhesion, even thickness along the outer surface of the article, high density), and improves its corrosion resistance.

If the process of coating application is carried out at article heating temperature below 150° C., the efficiency of coating application reduces, as well as the force of their adhesion to the article.

If the process of coating application is carried out at article heating temperature above 600° C., articles may be overheated, the articles and the formed coating may be damaged, and it also leads to additional power inputs.

If the process of coating application is carried out at charge capacity density in each unbalanced magnetron below 41 $W/cm^2$, this causes reduced efficiency of coating application and deterioration of their quality (even thickness along the outer surface of the article and deterioration of the coating adhesion).

If the coating application process is carried out with density of charge capacity in each unbalanced magnetron is more than 80 $W/cm^2$, this will cause overheating of articles and damage of the articles and the coating.

If the process of coating application is carried out at charge capacity density in each balanced magnetron below 40 $W/cm^2$, this causes reduced efficiency of coating application and deterioration of their quality (homogeneity, even thickness, and reduced force of adhesion).

If the coating application process is carried out with density of charge capacity in each balanced magnetron is more than 600 $W/cm^2$, this will cause overheating of articles and damage of the articles and the coating.

The proposed invention is illustrated by the following functions:

Figure 1:
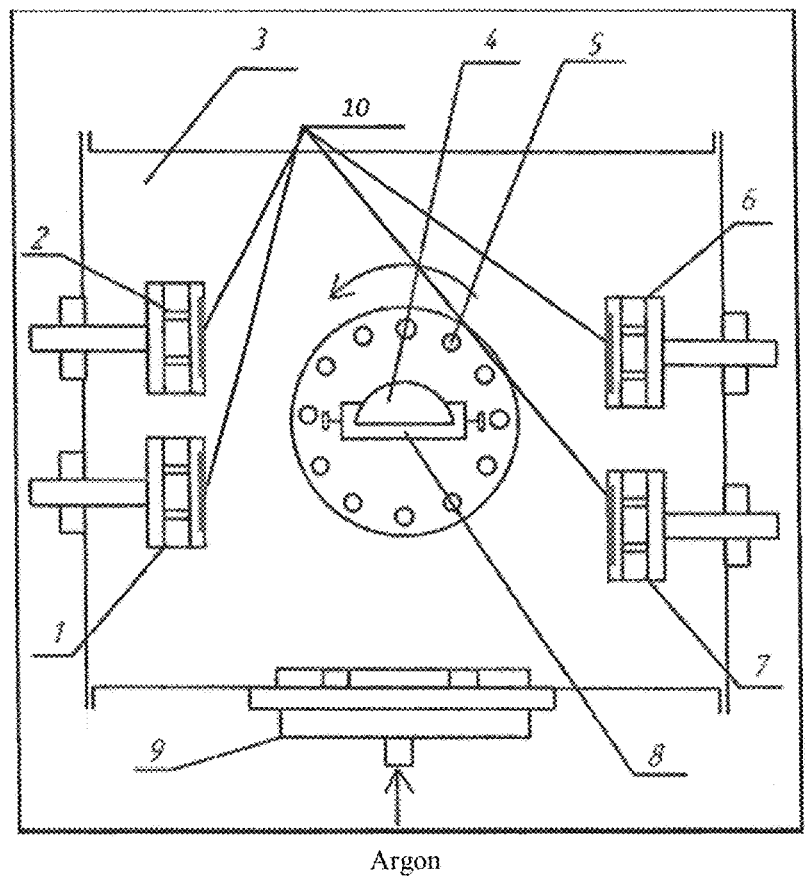
FIG. 1 shows the structural diagram of a vacuum plant, where 1, 2—unbalanced magnetrons with sputtered water-cooled targets; 3—a vacuum chamber; 4—a planetary mechanism of carousel type, 5—articles from zirconium alloys; 6, 7—balanced magnetrons; 8—rigging for fixation of articles; 9—ion source, 10—sputtered target.
Figure 2:
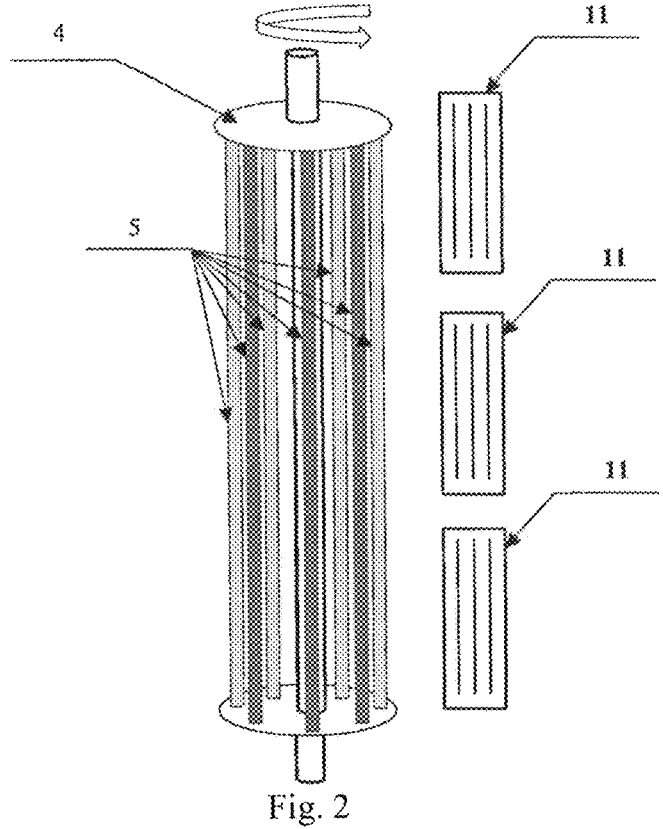
FIG. 2 shows the pattern of heater location, where 4—a planetary mechanism of rotary type; 5—articles of zirconium alloys; 11—heaters.

The method of ion plasma application of corrosion resistant film coatings onto articles from zirconium alloys consists in the fact that articles 5, which are seamless cold rolled pipes made of E110 zirconium alloy with outer diameter from 6 to 15 mm, length of up to 5 m, are fixed in positions for rotation of the planetary carousel mechanism 4, the vacuum chamber 3 is pumped to pressure of $(4-5) \times 10^{-3}$ Pa, the planetary carousel mechanism 4 rotation is activated, and articles 5 are heated using a heater 11 to temperature 150-600° C. For additional cleaning of surface in articles of zirconium alloys, ion etching and activation of surfaces shall be used with the help of water-cooled unbalanced magnetrons 1, 2, as well as additional activation of the articles surface using an ion source 9, generating gas ions, with accelerating voltage up to 5000 V. Activation of the surface in articles made of zirconium alloys 5 with argon ions is carried out at discharge current of 6-10 A and bias voltage of 100-200 V on the articles 5. Then targets 10 are sputtered using the ion-plasma method with the help of simultaneous use of unbalanced magnetrons 1, 2 and balanced magnetrons 6, 7, where targets of chrome are used, or its alloys with Cr. 0-75%, Al: 0-2.1%, Fe: 0-22%, Ni: 0-2.5%, at residual induction of the magnetic field from 0.03 T to 0.1 T using a complex based on the vacuum plant (FIG. 1). A coating 12 (FIG. 4) of chrome or its alloys with thickness of 5-25 μm is applied for 2-5 hours under operating pressure $(1-3) \times 10^{-1}$ Pa. Then articles made of zirconium alloys 5 are cooled together with the vacuum chamber 3, air is injected into the vacuum chamber 3, and then the articles 5 are extracted from the vacuum chamber 3.

The following methods are used to apply the coating based on chrome or its alloys: preliminary vacuum $<10^{-3}$ Pa; operating vacuum P=0.01-0.05 Pa; start voltage U=600-800 V; operating voltage U=350-700 V; charge capacity density 5-600 $W/cm^2$.

EXERCISE OF INVENTION

Example 1

In particular case the coating of chrome is applied on the articles made of zirconium alloys 5, which represent seamless cold rolled pipes made of zirconium alloy E110 with the surface in the delivery condition with outer diameter of 9.1 and 9.5 mm, length of up to 4 m.

Chrome targets 10 are used in the magnetron sputtering system.

First the articles made of zirconium alloys 5 are fixed in positions for rotation of the planetary carousel mechanism 4, the vacuum chamber 3 is pumped to pressure of $4 \times 10^{-3}$ Pa, the planetary carousel mechanism 4 rotation is activated, and articles 5 are heated using a heater 11 to temperature 250° C. For additional cleaning of surface in articles, ion etching and activation of surfaces shall be used with the help of water-cooled unbalanced magnetrons 1, 2, as well as additional activation of the articles surface using an ion source 9, generating gas ions, with accelerating voltage of 3000 V; activation of the surface in articles 5 with argon ions is carried out at discharge current 1.5 A and bias voltage of 100 V on the articles 5.

The chrome target 10 is sputtered by the ion-plasma method using simultaneously unbalanced magnetrons 1, 2 and balanced magnetrons 6, 7 with residual induction of the magnetic field of around 0.05 T using the complex based on the vacuum plant (FIG. 1). The chrome coating 12 with thickness of 7 and 15 μm is applied for 2 and 4 hours, accordingly, at operating pressure of $2 \times 10^{-1}$ Pa.

Then the articles 5 are cooled in the vacuum chamber 3 under residual pressure of $4 \times 10^{-3}$ Pa for 1.5-2 hours, and then air is injected into the vacuum chamber 3, then the articles 5 are removed from the vacuum chamber 3 and inspected for defects.

Figure 4:
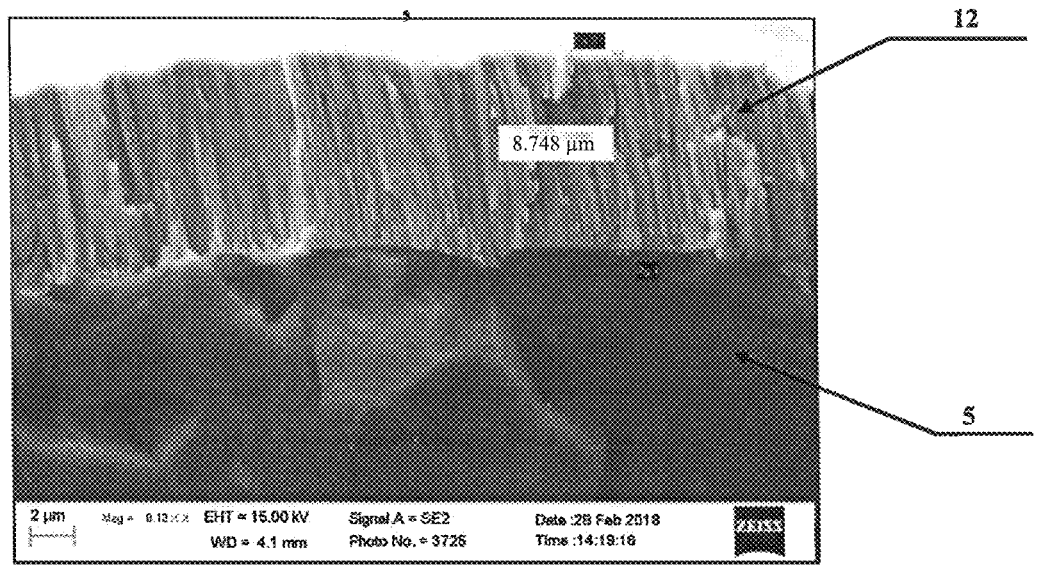
FIG. 4 shows a photo of a microstructure in the cross section of the zirconium alloy article transverse fracture, where 12—a layer of chrome coating, 5—zirconium alloy articles.

The structure and morphology of the corrosion resistant chrome coating 12 were tested by the method of scanning electronic microscopy in the cross sections of the transverse fracture of the chrome coating on the zirconium alloy article 5 (FIG. 4). The fracture plane is quite even and homogeneous. Pores, nonuniformities and flakes are unavailable. The coating is even along the thickness, the coating thickness is 8.748 μm. The chrome coating layer is tightly adjacent to the substrate made of alloy E110.

To test corrosion characteristics of the coatings, comparative high temperature corrosion tests were carried out on samples with or without a chrome coating.

Comparative corrosion tests of samples made of E110 alloy by the ion-plasma coating application method are carried out with the following parameters: medium—vapor, pressure—atmospheric, test type—double-sided oxidation, test temperature—1000-1200° C., vapor flowrate—25-90 g/hr (~1.5-5.5 mg/cm$^2$/s), heating speed of around 50°, cooling speed is 20° minimum per second, sample length—30 mm, test duration—4000 s.

Figure 3:
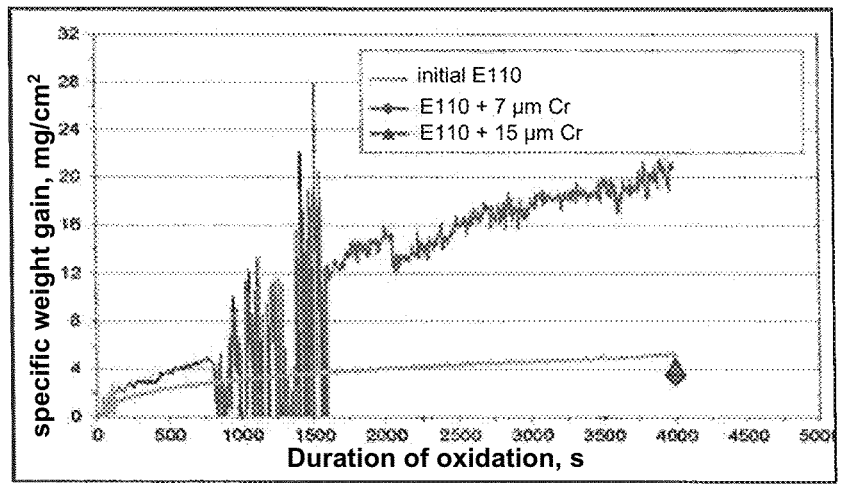
FIG. 3 shows a comparative diagram changing the weight gain depending on the test time in the samples made of zirconium alloy without or with a coating applied by ion-plasma method in superheated vapor.

FIG. 3 shows a comparative diagram changing the weight gain of samples depending on the test time in the samples made of zirconium alloy without or with a chrome-based coating applied by ion-plasma method in superheated vapor. Sample weight gain is a characteristic of corrosion properties of coatings under the conditions simulating a beyond design basis loss of coolant accident (LOCA).

During oxidation of the initial uncoated sample made of E110 alloy in vapor, after 770° C. there is a flaking oxide film being produced.

Oxidation of samples from E110 alloy with the applied chrome-based coating happened at a lower speed compared to the initial sample made of E110 alloy.

Comparatively high temperature tests in vapor at 1000-1200° C. demonstrated that speed of sample oxidation with a chrome coating was 5 times lower than in uncoated samples in the initial state.

The survey data confirm that chrome coating characteristics provide for high corrosion resistance of articles made of zirconium alloys in the superheated vapor.

Example 2

In another particular case the coating of chrome alloy is applied on the articles made of zirconium alloys 5, which represent seamless cold rolled pipes made of zirconium alloy E110 with the surface in the delivery condition with outer diameter of 9.1 and 9.5 mm, length of up to 4 m.

The magnetron sputtering system uses targets 10 made of chrome alloy containing Cr: 0-75%, Al: 0-2.1%, Fe: 0-22%, Ni: 0-2.5%.

First the articles 5 are fixed in positions for rotation of the planetary carousel mechanism 4, the vacuum chamber 3 is pumped to pressure of $4\times10^{-3}$ Pa, the planetary carousel mechanism 4 rotation is activated, and articles 5 are heated using a heater 11 to temperature 150° C. For additional cleaning of surface in articles made of zirconium alloys, ion etching and activation of articles surfaces shall be used with the help of water-cooled unbalanced magnetrons 1, 2, as well as additional activation of the articles surface using an ion source 9, generating gas ions, with accelerating voltage of 2000 V; activation of the surface in articles 5 with argon ions is carried out at discharge current 1, 2 A and bias voltage of 150 V on the articles 5.

The chrome alloy target 10 is sputtered by the ion-plasma method using simultaneously unbalanced magnetrons 1, 2 and balanced magnetrons 6, 7 with residual induction of the magnetic field of around 0.05 T using the complex based on the vacuum plant (FIG. 1). The chrome alloy coating with thickness of 7 and 15 μm is applied for 2.5 and 4.5 hours, accordingly, at operating pressure of $2\times10^{-1}$ Pa.

Then the articles made of zirconium alloy 5 are cooled in the vacuum chamber 3 under residual pressure of $4\times10^{-3}$ Pa for 1.5-2 hours, and then air is injected into the vacuum chamber 3, then the articles 5 are removed from the vacuum chamber 3 and inspected for defects.

The structure of fracture in a corrosion-resistant coating made of a chrome-based alloy containing Cr: 0-75%, Al: 0-2.1%, Fe: 0-22%, Ni: 0-2.5% in the cross section of the coating on the article made of zirconium alloy 5 is smooth and homogeneous. There are no pores or flakes. The coating is even in thickness, coating thickness is 8.5 μm, it tightly adjoins the substrate made of E110 alloy.

To test corrosion characteristics of the coatings, comparative high temperature corrosion tests were carried out on samples with or without a chrome-based coating.

Corrosion tests are carried out with the following parameters: medium—vapor, pressure— atmospheric, test type—double-sided oxidation, test temperature—1000-1200° C., vapor flowrate—25-90 g/hr (~1.5-5.5 mg/cm$^2$/s), heating speed of around 50°, cooling speed is 20° minimum per second, sample length—30 mm, test duration—4000 s.

Weight gain depending on the time of testing samples made of zirconium alloy without or with a chrome-based coating applied by the ion-plasma method in the superheated vapor is 24 mg/dm$^2$ and 11 mg/dm$^2$ after 30 days, accordingly, and 30 mg/dm$^2$ and 14 mg/dm$^2$ after 60 days, accordingly. Sample weight gain is a characteristic of corrosion properties of coatings under the conditions simulating a beyond design basis loss of coolant accident (LOCA).

During oxidation of the initial uncoated sample made of E110 alloy in vapor, after 770° C. there is a flaking oxide film being produced.

Oxidation of samples from E110 alloy with the applied chrome-based alloy coating happened at a lower speed compared to the initial sample made of E110 alloy.

The technical result is achieved by a method of ion-plasma application of a corrosion-resistant film coating on a plurality of articles made from zirconium alloys, wherein the articles include a plurality of surfaces, wherein the method including:

placing the articles in a planetary carousel mechanism, performing ion-beam etching and surface activation of the surfaces using a plurality of water-cooled unbalanced magnetrons, performing additional activation of the surfaces using an ion source which generates a plurality of gas ions with an accelerating voltage of up to 5000 V, inclusively, while feeding of a bias voltage to the articles, applying the corrosion-resistant film coating by using an unbalanced magnetron and a balanced magnetron simultaneously with a residual induction of a magnetic field from 0.03 T to 0.1 T, inclusively, characterized in that (i) the articles made from zirconium alloys are heated by a plurality of heaters to a temperature between 150° C. and 249° C. before ion-beam etching is performed, inclusively, (ii) the film coating is applied to the articles placed vertically in the planetary carousel mechanism, and (iii) the articles are heated by the heaters when the corrosion-resistant film coating is applied to the temperature between 150° C. and 600° C., inclusively, wherein the heaters are positioned along the entire length of the articles facing the articles, and (iv) the unbalanced magnetron has a discharge power density between 41 W/cm2 and 80 W/cm2, inclusively, and the balanced magnetron has a discharge power density between 40 W/cm2 and 600 W/cm2, inclusively.

In one embodiment, the unbalanced magnetron has a discharge power density between 5 W/cm$^2$ and 80 W/cm$^2$, inclusively.

In one embodiment, the balanced magnetron has a discharge power density between 40 W/cm$^2$ and 600 W/cm$^2$, inclusively.

In one embodiment, the corrosion-resistant film coating is a chromium coating.

In one embodiment, the corrosion-resistant film coating is a chromium alloy film coating comprising Al, Fe, Ni, Cr.

INDUSTRIAL APPLICABILITY

Comparative high temperature tests in vapor at 1000-1200° C. demonstrated that speed of sample oxidation with a chrome-based coating was 5 times lower than in uncoated samples in the initial state.

The survey data confirm that chrome-based coating characteristics provide for high corrosion resistance of articles made of zirconium alloys in the superheated vapor.

Therefore, the proposed invention makes it possible to obtain corrosion resistant film coatings of even thickness along the outer surface of the articles from zirconium alloys and improving quality of applied coatings through even heating of the entire surface of articles, as well as increasing efficiency of coating application process through higher density of magnetron charge capacity density.

The invention claimed is:

1. A method of ion-plasma application of a single corrosion-resistant film coating on each outer surface of a plurality of articles consisting essentially of zirconium alloys such that the single corrosion-resistant film coating is outermost, wherein the method including:

placing the articles in a planetary carousel mechanism, performing ion-beam etching and surface activation of the outer surfaces of the articles using a plurality of water-cooled unbalanced magnetrons, performing additional activation of the outer surfaces using an ion source which generates a plurality of gas ions with an accelerating voltage of up to 5000 V, inclusively, while feeding of a bias voltage to the articles, applying the single corrosion-resistant film coating by using an unbalanced magnetron and a balanced magnetron simultaneously with a residual induction of a magnetic field from 0.03 T to 0.1 T, inclusively, characterized in that (i) the articles consisting essentially of zirconium alloys are heated by a plurality of heaters to a temperature between 150° C. and 249° C. before ion-beam etching is performed, inclusively, (ii) the single corrosion-resistant film coating is applied to the outer surfaces of the articles placed vertically in the planetary carousel mechanism, (iii) the articles are heated by the heaters when the single corrosion-resistant film coating is applied to a temperature between 150° C. and 600° C., inclusively, wherein the heaters are positioned along the entire length of the articles facing the outer surfaces of the articles, and (iv) the unbalanced magnetron has a discharge power density between 41 W/cm$^2$ and 80 W/cm$^2$, inclusively, and the balanced magnetron has a discharge power density between 40 W/cm$^2$ and 600 W/cm$^2$, inclusively.

2. The method according to claim 1, wherein the single corrosion-resistant film coating is a chromium coating.

3. The method according to claim 1, wherein the single corrosion-resistant film coating is a chromium alloy film coating comprising Al, Fe, Ni, Cr.

* * * * *